United States Patent
Hamner et al.

(10) Patent No.: US 7,918,683 B1
(45) Date of Patent: Apr. 5, 2011

(54) CONNECTOR ASSEMBLIES AND DAUGHTER CARD ASSEMBLIES CONFIGURED TO ENGAGE EACH OTHER ALONG A SIDE INTERFACE

(75) Inventors: Richard Elof Hamner, Hummelstown, PA (US); Robert Neil Mulfinger, York Haven, PA (US); Jason M'Cheyne Reisinger, Carlisle, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/730,958

(22) Filed: Mar. 24, 2010

(51) Int. Cl.
*H01R 13/64* (2006.01)
(52) U.S. Cl. .......................................... 439/377; 439/64
(58) Field of Classification Search .................. 439/377, 439/160, 372, 10, 376, 64; 361/798
See application file for complete search history.

(56) References Cited

U.S. PATENT DOCUMENTS

| | | | |
|---|---|---|---|
| 4,012,093 A | 3/1977 | Crane | |
| 4,012,095 A | 3/1977 | Doucet et al. | |
| 4,085,990 A | 4/1978 | Jayne | |
| 4,428,632 A | 1/1984 | Rich | |
| 4,731,698 A | 3/1988 | Millot et al. | |
| 4,895,521 A | 1/1990 | Grabbe | |
| 4,895,522 A | 1/1990 | Grabbe et al. | |
| 5,441,424 A | 8/1995 | Morlion et al. | |
| 5,772,451 A | 6/1998 | Dozier, II et al. | |
| RE36,065 E | 1/1999 | Andrews et al. | |
| 5,904,581 A | 5/1999 | Pope et al. | |
| 6,027,345 A | 2/2000 | McHugh et al. | |
| 6,083,047 A | 7/2000 | Paagman | |
| 6,116,965 A | 9/2000 | Arnett et al. | |
| 6,135,781 A | 10/2000 | Pope et al. | |
| 6,231,391 B1 | 5/2001 | Ramey | |
| 6,310,286 B1 | 10/2001 | Troxel et al. | |
| 6,394,822 B1 | 5/2002 | McNamara | |
| 6,443,745 B1 | 9/2002 | Ellis et al. | |
| 6,461,202 B2 | 10/2002 | Kline | |
| 6,537,087 B2 | 3/2003 | McNamara et al. | |
| 6,551,140 B2 | 4/2003 | Billman et al. | |
| 6,623,280 B2 | 9/2003 | Oldenburg et al. | |

(Continued)

FOREIGN PATENT DOCUMENTS

EP 0459356 8/1995

OTHER PUBLICATIONS

Neoconix PCBeam™ Interposer Design Guide, Neoconix, Rev. 070925, 4 pgs.

*Primary Examiner* — Hae Moon Hyeon

(57) ABSTRACT

A connector assembly including a connector that has a mating surface with an array of connector terminals thereon. The mating surface interfaces with a side surface of a daughter card assembly when the daughter card assembly is moved to an engaged position. The array of connector terminals are configured to engage an array of card terminals of the daughter card assembly. The connector assembly also includes a guide assembly that has a guide channel and a cam member that slidably engages the guide channel to direct the daughter card assembly to an offset position. In the offset position, the side and mating surfaces form a non-orthogonal angle with respect to each other. The guide channel is configured to permit the daughter card assembly to be rotated about an axis of rotation so that the daughter card assembly moves from the offset position to the engaged position.

20 Claims, 7 Drawing Sheets

U.S. PATENT DOCUMENTS

| | | |
|---|---|---|
| 6,682,368 B2 | 1/2004 | Murr et al. |
| 6,695,646 B1 | 2/2004 | Grabbe |
| 6,699,048 B2 | 3/2004 | Johnson et al. |
| 6,705,895 B2 | 3/2004 | Hasircoglu |
| 6,712,620 B1 | 3/2004 | Li et al. |
| 6,739,910 B1 | 5/2004 | Wu |
| 6,743,049 B2 | 6/2004 | Perugini et al. |
| 6,743,057 B2 | 6/2004 | Davis et al. |
| 6,809,255 B1 | 10/2004 | Chun |
| 6,866,521 B1 | 3/2005 | Harper, Jr. |
| 6,875,056 B1 | 4/2005 | Bianchini et al. |
| 6,899,550 B2 | 5/2005 | Perugini et al. |
| 6,902,416 B2 | 6/2005 | Feldman |
| 6,917,525 B2 | 7/2005 | Mok et al. |
| 6,918,776 B2 | 7/2005 | Spink |
| 6,932,618 B1 | 8/2005 | Nelson |
| 6,932,655 B2 | 8/2005 | Hatterscheid et al. |
| 6,945,788 B2 | 9/2005 | Trout et al. |
| 6,951,482 B1 | 10/2005 | Miller et al. |
| 7,018,239 B2 | 3/2006 | Zaderej et al. |
| 7,021,945 B2 | 4/2006 | Perugini et al. |
| 7,044,746 B2 | 5/2006 | Copper et al. |
| 7,086,913 B2 | 8/2006 | Myer et al. |
| 7,097,470 B2 | 8/2006 | Harper |
| 7,114,961 B2 | 10/2006 | Williams |
| 7,207,807 B2 | 4/2007 | Fogg |
| 7,244,125 B2 | 7/2007 | Brown et al. |
| 7,262,672 B2 | 8/2007 | Lee et al. |
| 7,309,239 B2 | 12/2007 | Shuey et al. |
| 7,390,194 B1 | 6/2008 | Crippen et al. |
| 7,419,400 B1 | 9/2008 | Taylor et al. |
| 7,420,816 B2 * | 9/2008 | Rubenstein .................. 361/759 |
| 7,425,134 B1 | 9/2008 | Taylor |
| 7,429,176 B2 | 9/2008 | Johnescu et al. |
| 7,438,582 B2 | 10/2008 | Taylor |
| 7,465,195 B1 | 12/2008 | Kerrigan et al. |
| 7,470,149 B2 | 12/2008 | Kazama et al. |
| 7,771,207 B2 * | 8/2010 | Hamner et al. ................. 439/65 |
| 7,789,668 B1 * | 9/2010 | Hamner et al. ................. 439/65 |
| 7,789,669 B1 * | 9/2010 | Duesterhoeft et al. .......... 439/65 |
| 2001/0049207 A1 | 12/2001 | Sakata et al. |
| 2002/0151218 A1 | 10/2002 | Figueroa et al. |
| 2003/0027439 A1 | 2/2003 | Johnescu et al. |
| 2003/0064614 A1 | 4/2003 | Tanaka et al. |
| 2003/0082954 A1 | 5/2003 | Espenshade et al. |
| 2003/0162442 A1 | 8/2003 | Panella |
| 2004/0166704 A1 | 8/2004 | Perugini et al. |
| 2004/0174223 A1 | 9/2004 | Achyut |
| 2006/0019517 A1 | 1/2006 | Raistrick et al. |
| 2007/0197095 A1 | 8/2007 | Feldman et al. |
| 2008/0032524 A1 | 2/2008 | Lemke et al. |
| 2008/0188098 A1 | 8/2008 | Boesch et al. |
| 2008/0214059 A1 | 9/2008 | Rothermel et al. |
| 2008/0227314 A1 | 9/2008 | Taylor |
| 2008/0233806 A1 | 9/2008 | Rothermel et al. |

* cited by examiner

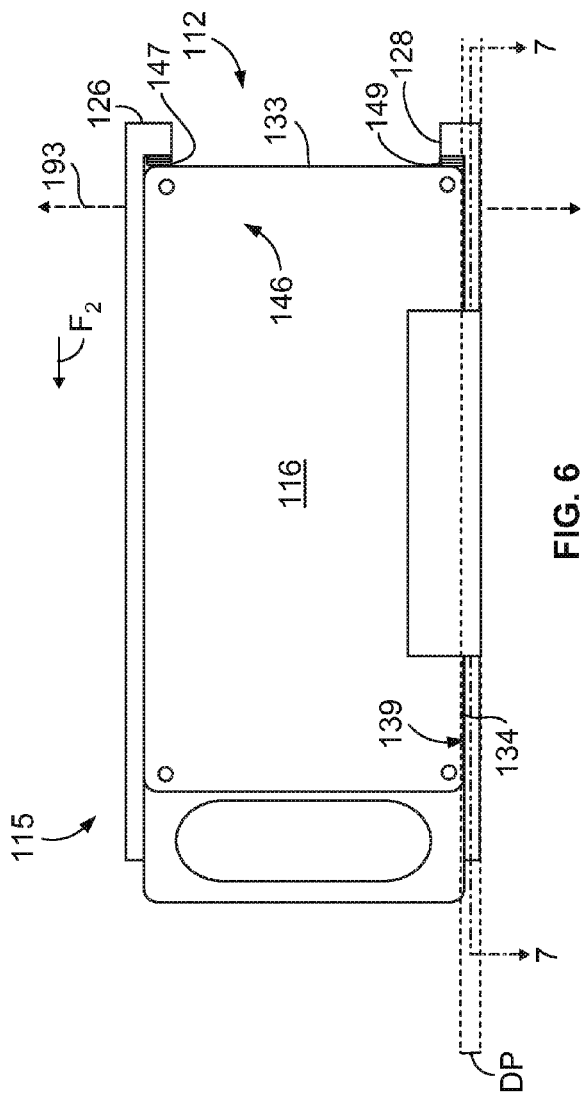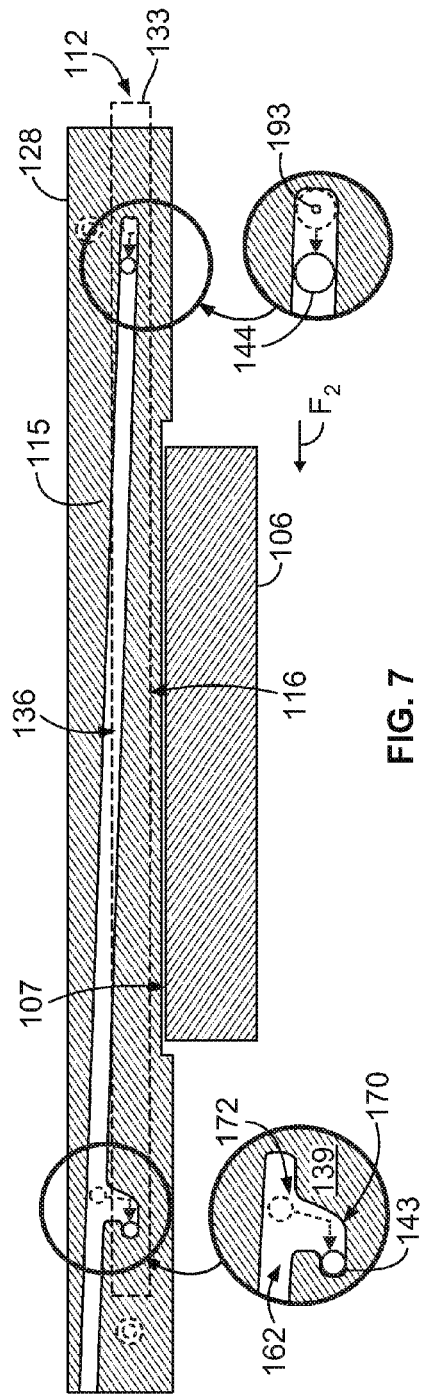

CONNECTOR ASSEMBLIES AND DAUGHTER CARD ASSEMBLIES CONFIGURED TO ENGAGE EACH OTHER ALONG A SIDE INTERFACE

BACKGROUND OF THE INVENTION

The subject matter herein relates generally to connector assemblies, and more particularly, to connector assemblies that are configured to engage daughter card assemblies inserted into an electrical, optical, or computing system.

Some systems, such as servers, routers, and data storage systems, utilize connector assemblies for transmitting signals and/or power through the system. Such systems typically include a backplane or a midplane circuit board, a motherboard, and a plurality of daughter cards. The systems also include one or more connectors that are attached to the circuit board(s) for interconnecting the daughter cards to the circuit board(s) when the daughter card is inserted into the system. Each daughter card includes a header or receptacle assembly having a mating face that is configured to connect to a mating face of the connector. The header/receptacle assembly is typically positioned on or near a leading edge of the daughter card. Prior to being mated, the mating faces of the header/receptacle assembly and the connector are aligned with each other and face each other along a mating axis. The daughter card is then moved in an insertion direction along the mating axis until the mating faces engage and mate with each other.

The conventional backplane and midplane connector assemblies provide for interconnecting the daughter cards to the backplane or midplane circuit board by moving the daughter card in an insertion direction which is the same as the mating direction. In some cases it may be desirable to mate the daughter card in a mating direction that is perpendicular to the insertion direction. However, when the header/receptacle assembly is on a surface of the daughter card and faces a direction perpendicular to the insertion direction (e.g., perpendicular to a surface of the daughter card) and the connector is on the backplane circuit board and also faces a direction perpendicular to the insertion direction, it may be difficult to properly align and mate the header/receptacle assembly and the connector.

Accordingly, there is a need for a connector assembly that facilitates interconnecting a daughter card to another component along a mating direction that is perpendicular to an insertion direction of the daughter card.

BRIEF DESCRIPTION OF THE INVENTION

In one embodiment, a connector assembly is provided that is configured to engage a removable daughter card assembly having leading and trailing ends and a side surface extending therebetween. The connector assembly includes a connector that has a mating surface including an array of connector terminals thereon. The mating surface interfaces with the side surface of the daughter card assembly when the daughter card assembly is moved to an engaged position. The array of connector terminals is configured to electrically engage an array of card terminals on the side surface when the daughter card assembly is moved to the engaged position. The electrical connector assembly also includes a guide assembly that includes a guide channel and a cam member that slidably engages the guide channel to direct the daughter card assembly to an offset position. The side and mating surfaces form a non-orthogonal angle with respect to each other when the daughter card assembly is in the offset position such that card terminals proximate to the leading end and card terminals proximate to the trailing end are positioned at different distances away from the mating surface. The guide channel is configured to permit the daughter card assembly to be rotated about an axis of rotation. The daughter card assembly moves from the offset position to the engaged position where the side and mating surfaces are substantially parallel to one another.

In another embodiment, a connector assembly is provided that is configured to engage a removable daughter card assembly having leading and trailing ends and a side surface extending therebetween. The electrical connector assembly includes a connector that has a mating surface including an array of connector terminals thereon. The mating surface interfaces with the side surface of the daughter card assembly when the daughter card assembly is moved to an engaged position. The array of connector terminals is configured to electrically engage an array of card terminals on the side surface when the daughter card assembly is moved to the engaged position. The electrical connector assembly also includes a guide channel that extends along and has a fixed position relative to the mating surface. The guide channel is configured to slidably interact with a cam member attached to the daughter card assembly to direct the daughter card assembly to an offset position. The side and mating surfaces form a non-orthogonal angle with respect to each other when the daughter card assembly is in the offset position such that card terminals proximate to the leading end and card terminals proximate to the trailing end are different distances away from the mating surface. The guide channel is configured to permit the daughter card assembly to be rotated about an axis of rotation. The daughter card assembly moves from the offset position to the engaged position where the side and mating surfaces are substantially parallel to one another.

In yet another embodiment, a removable daughter card assembly is provided that is configured to be inserted into a system to engage a connector. The daughter card assembly includes leading and trailing ends. The leading end is inserted into the system before the trailing end. The daughter card assembly also includes a side surface that extends between the leading and trailing ends and an array of card terminals on the side surface that are configured to engage an array of connector terminals on a mating surface of the connector. The daughter card assembly also includes a guide channel that extends along and has a fixed position relative to the side surface. The guide channel is configured to slidably interact with a cam member that has a fixed position relative to the mating surface of the connector. The guide channel directs the side surface to an offset position relative to the mating surface. The side and mating surfaces form a non-orthogonal angle with respect to each other when the side surface is in the offset position such that card terminals proximate to the leading end and card terminals proximate to the trailing end are different distances away from the mating surface. The guide channel is configured to permit the side surface to be rotated about an axis of rotation. The side surface moves from the offset position to the engaged position where the side and mating surfaces are substantially parallel to one another.

BRIEF DESCRIPTION OF THE DRAWINGS

FIG. 6 is a side view of the daughter card assembly in an engaged position with respect to the connector of FIG. 3.

FIG. 7 is a cross-section of a guide rail taken along the line 7-7 in FIG. 6.

DETAILED DESCRIPTION OF THE INVENTION

Embodiments described herein include connector assemblies that are configured to establish at least one of an electrical coupling and an optical coupling (e.g., for transmitting data signals or power) between different components. The components that are interconnected by the connector assemblies may be daughter card assemblies that include printed circuits (e.g., circuit boards or flex circuits), other connectors (e.g., optical and/or electrical connectors), or any other components that are capable of establishing an electrical or optical coupling to the connectors. In some embodiments, the connector assembly includes one or more connectors that have terminals that are configured to couple to or engage with other terminals of a daughter card assembly to establish the electrical and/or optical coupling. For example, the terminals may be mating contacts for establishing an electrical connection or optical fiber terminals for establishing an optical connection. Embodiments described herein also include a guide assembly having a guide channel and at least one cam member that slidably engages the guide channel to direct the daughter card assembly to an offset position. The guide channel is configured to permit the daughter card assembly to be rotated about an axis of rotation from the offset position to an engaged position.

Figure 1:
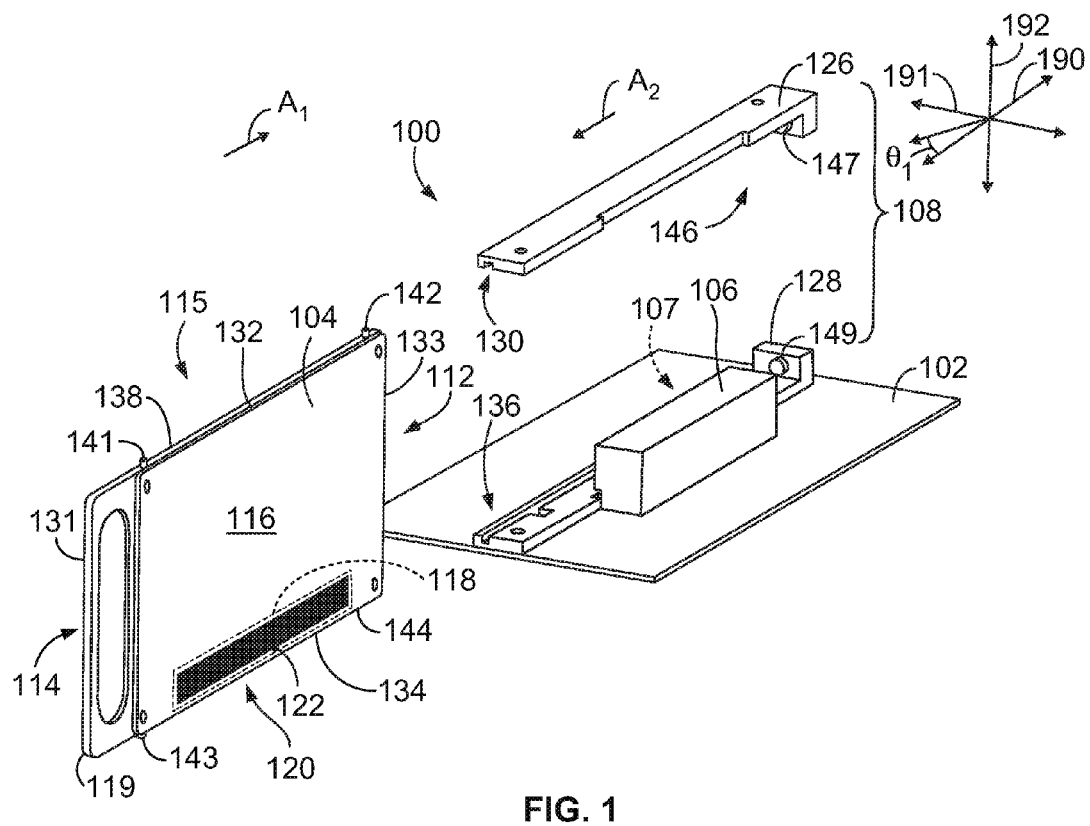
FIG. 1 is a front perspective of a connector assembly formed in accordance with one embodiment.

FIG. 1 is a front perspective view of a connector assembly 100 formed in accordance with one embodiment. The connector assembly 100 is configured to communicatively interconnect different components, such as a first printed circuit 102 and a second printed circuit 104. In the illustrated embodiment, the printed circuit 102 is a motherboard that may be part of an electrical or computing system (not shown), and the printed circuit 104 is a circuit board of a removable daughter card assembly 115. The connector assembly 100 includes a connector 106 and a guide assembly 108 that is configured to direct the daughter card assembly 115 to a position alongside the connector 106. As shown, the connector assembly 100 is oriented with respect to a longitudinal axis 190, a lateral axis 191, and a vertical axis 192.

The connector 106 is configured to communicatively engage the daughter card assembly 115 when the daughter card assembly 115 is moved to an engaged position alongside the connector 106. As used herein, components are "communicatively engaged" if an electrical and/or optical connection is established therebetween. The connection may transmit data signals and/or power. The connector 106 includes a mating surface 107 that extends parallel to the longitudinal axis 190. The mating surface 107 includes an array 150 of connector terminals 152 (shown in FIG. 3). As used herein, the term "terminals" includes mating contacts configured to establish an electrical connection or optical terminals configured to establish an optical connection. In some embodiments, the terminals along a connector or daughter card assembly may include both mating contacts and also optical terminals. Mating contacts may be stamped and formed, etched and formed, solder balls, pads, press-fit contacts, compression contacts, and the like. In some embodiments, the terminals form a planar array (i.e., the terminals are arranged substantially co-planar with respect to each other). In some embodiments, the array may have multiple sub-arrays of terminals.

The daughter card assembly 115 includes the printed circuit 104 and extends between leading and trailing ends 112 and 114 in which the leading end 112 is inserted into the system or the connector assembly 100 before the trailing end 114. The daughter card assembly 115 includes a side surface 116 that extends between the leading and trailing ends 112 and 114, and also includes a plurality of edges 131-134 that include longitudinal edges 132 and 134 that are spaced apart from each other and extend substantially parallel to the longitudinal axis 190. Vertical edges 131 and 133 are spaced apart from each other and extend substantially parallel to the vertical axis 192. Also shown, the side surface 116 includes a terminal area or footprint 118 having an array 120 of card terminals 122. In the illustrated embodiment, the connector terminals 152 and the card terminals 122 are mating contacts that establish an electrical connection. However, the connector 106 and the daughter card assembly 115 may also be configured such that the connector and card terminals 152 and 122, respectively, include optical terminals.

The daughter card assembly 115 may also include a card body or frame 138 that is attached to the printed circuit 104. In alternative embodiments, the card body 138 may form a housing that encloses at least a portion of the printed circuit 104. Furthermore, in the illustrated embodiment, the daughter card assembly 115 includes cam members 141-144 that have a fixed position relative to the side surface 116. The cam members 141-144 may be attached to the card body 138 proximate to the longitudinal edges 132 and 134 and project in a vertical direction away from the respective edge.

Figure 2:
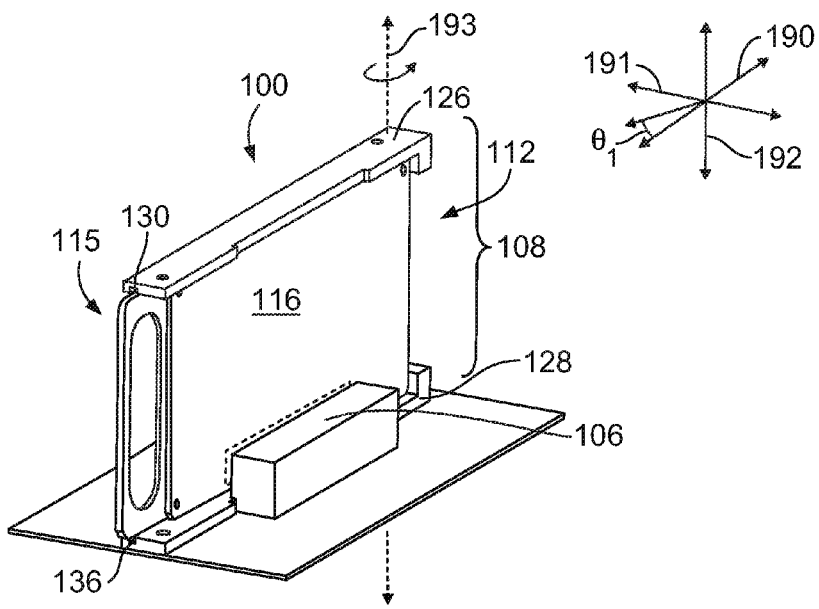
FIG. 2 is a front perspective view of the connector assembly of FIG. 1 shown with a removable daughter card assembly in an offset position.

FIG. 2 is a front perspective view of the connector assembly 100 when the daughter card assembly 115 is in an offset position relative to the connector 106 before the daughter card assembly 115 is moved to the engaged position. With reference to both FIGS. 1 and 2, to move the daughter card assembly 115 and, more specifically, the side surface 116 to the offset position, the guide assembly 108 includes a pair of spaced apart guide rails 126 and 128 that include respective guide channels 130 and 136. When the daughter card assembly 115 engages the guide assembly 108, the cam members 141 and 142 (FIG. 1) are received by the guide channel 130 and the cam members 143 and 144 (FIG. 1) are received by the guide channel 136. To insert the daughter card assembly 115 into the guide assembly 108, an operator (human or machine) may engage a handle 119 (FIG. 1) of the daughter card assembly 115 and apply an insertion force in a first or loading direction (indicated by an arrow $A_1$ in FIG. 1). The cam members 141-144 slidably engage the corresponding guide channels 130 and 136, which direct the daughter card assembly 115 into the system.

The guide channels 130 and 136 are configured to direct the daughter card assembly 115 through loading and mating stages. During the loading stage, the guide channels 130 and 136 direct side surface 116 of the daughter card assembly 115 to an offset position alongside the mating surface 107 (FIG. 1) of the connector 106. In the offset position, the side surface 116 is spaced apart from the mating surface 107 of the connector 106 and may be angled with respect to the mating surface 107. More specifically, a vertical plane (i.e., a plane that is parallel to the vertical axis 192) extending along the side surface 116 may form a non-orthogonal angle $\theta_1$ with respect to a vertical plane extending along the mating surface 107. (As shown in FIGS. 1 and 2, the non-orthogonal angle $\theta_1$ is indicated between the axes 191 and 190.)

During the mating stage, the guide channels 130 and 136 are configured to permit the side surface 116 (or the daughter card assembly 115) to be rotated about an axis of rotation 193 (FIG. 2) that is located proximate to the leading end 112. The axis of rotation 193 may extend parallel to the vertical axis 192. Thus, the side surface 116 may rotate about the axis of rotation 193 between the offset and engaged positions. In the engaged position, the side and mating surfaces 116 and 107 interface with each other and are substantially parallel to one another.

Although the loading and mating stages were described above as separate stages, the loading and mating stages may overlap each other. For example, when the array 120 of card terminals 122 becomes substantially aligned with the array 150 of connector terminals 152 (FIG. 3) during the loading stage, the guide channels 130 and 136 may move or rotate the daughter card assembly 115 toward the connector 106.

Returning to FIG. 1, in some embodiments, the connector assembly 100 may include a biasing mechanism 146 that is configured to prevent an inadvertent release of the daughter card assembly 115 from the engaged position. The biasing mechanism 146 may engage the daughter card assembly 115 and provide a force in a second or biasing direction (indicated by an arrow $A_2$). In the illustrated embodiment, the biasing mechanism 146 is a pair of biasing springs 147 and 149 in which each biasing spring is attached to a corresponding guide rail 126 and 128. The biasing mechanism 146 may press a portion of the daughter card assembly 115 against a portion of the connector assembly 100 to generate frictional forces. The frictional forces may resist movement of the daughter card assembly 115 to prevent an inadvertent release of the daughter card assembly 115 from the engaged position.

The biasing mechanism 146 may be coupled to at least one of the connector assembly 100 and the daughter card assembly 115. In the illustrated embodiment, the biasing mechanism 146 is attached to the connector assembly 100. However, in alternative embodiments, the biasing springs 147 and 149 may be coupled to the leading end 112 of the daughter card assembly 115 and configured to engage a portion of the guide rails 126 and 128, respectively, when the daughter card assembly 115 has been moved to the offset position. Furthermore, in other embodiments, the biasing mechanism 146 may include a moveable latch or device that pushes or pulls the daughter card assembly 115 in the biasing direction $A_2$. In such alternative embodiments, the biasing mechanism 146 may generate frictional forces between the connector assembly 100 and the daughter card assembly 115. The frictional forces may resist movement of the daughter card assembly 115 to prevent an inadvertent release of the daughter card assembly 115 from the engaged position.

In the illustrated embodiment shown in FIG. 1, the guide channels 130 and 136 have respective fixed positions relative to the mating surface 107 of the connector 106, and the cam members 141-144 have fixed positions relative to the side surface 116 of the daughter card assembly 115. However, in alternative embodiments, the guide channels 130 and 136 may have fixed positions relative to the side surface 116. More specifically, the daughter card assembly 115 may include the guide rails 126 and 128 and the respective guide channels 130 and 136. The cam members 141-144 may have fixed positions relative to the mating surface 107.

As used herein, a "removable daughter card assembly" includes an array of card terminals that is configured to engage an array of connector terminals of a communication connector, such as the connector 106. A daughter card assembly may be inserted into an electrical or computing system so that the array of card terminals has a predetermined orientation and position with respect to the array of connector terminals. The daughter card assembly may be removably coupled to the connector. A daughter card assembly may be sized and shaped so that the daughter card assembly may be carried and inserted/removed by an operator or a machine. Furthermore, a daughter card assembly may have sufficient structure to withstand repeated insertions and removals from a corresponding system without damaging the removable daughter card assembly. The daughter card is removably coupled to the connector such that connector and the daughter card may be readily separated from and coupled (electrically, optically, and/or mechanically) to each other without destroying or damaging the card or connector terminals.

The term "printed circuit," as used herein, includes any electric circuit in which the conducting connections have been printed or otherwise deposited in predetermined patterns on an insulating base or substrate. For example, a printed circuit may be a circuit board, an interposer made with printed circuit board material, a flexible circuit, a substrate having one or more layers of flexible circuit therealong, and the like. A printed circuit typically includes mating contacts arranged on a side surface thereof. A printed circuit may also be a flexible circuit (also called flex circuit) that includes an arrangement of conductors embedded within or between flexible insulating material(s).

Figure 3:
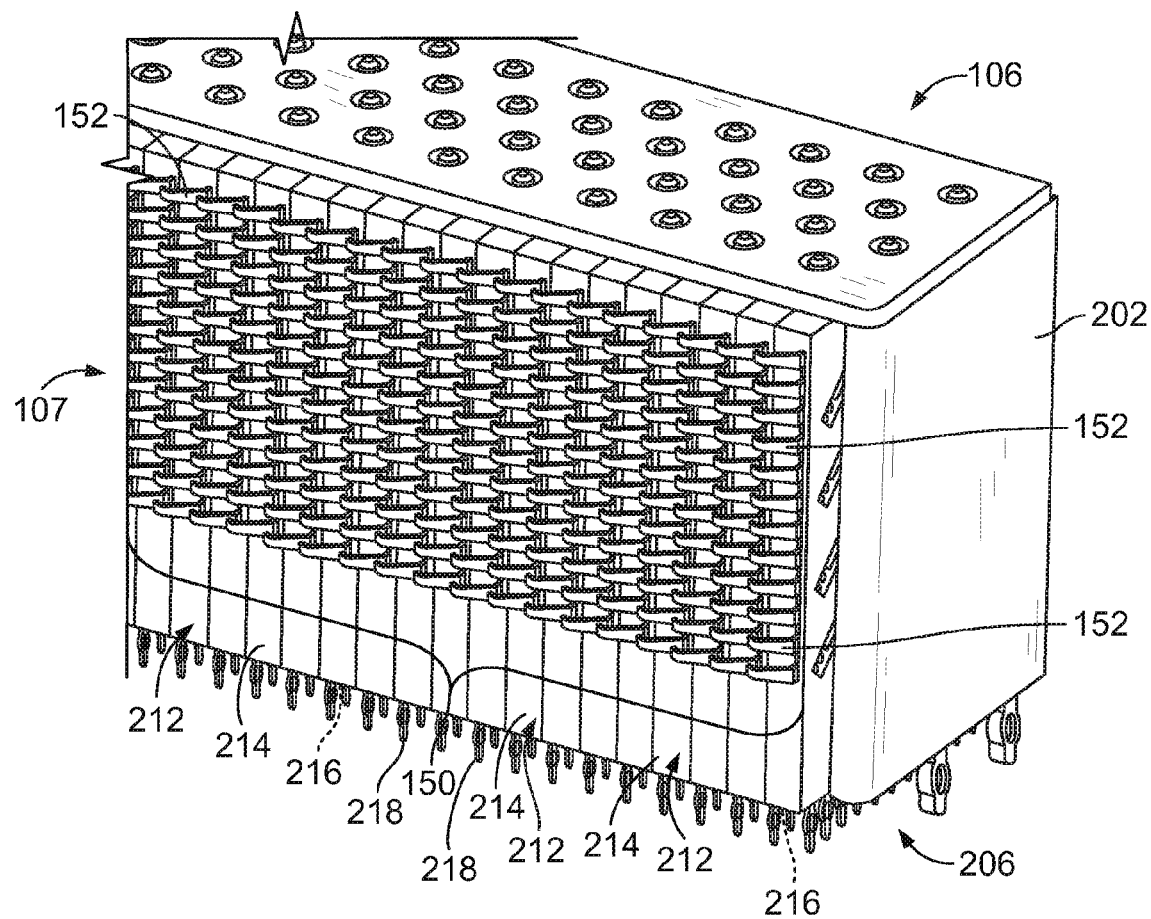
FIG. 3 is an enlarged front view of a connector that may be used with the connector assembly of FIG. 1.

FIG. 3 is an enlarged perspective view of the connector 106. In the illustrated embodiment, the connector 106 includes a connector body 202 having the mating surface 107 and a mounting face 206. The mating surface 107 may include the array 150 of connector terminals 152 projecting therefrom. The mating surface 107 interfaces with the side surface 116 (FIG. 1) when the daughter card assembly 115 (FIG. 1) is in the engaged position. The array 150 of connector terminals 152 is configured communicatively engage the array 120 (FIG. 1) of card terminals 122 (FIG. 1). The connector body 202 receives and is configured to hold a plurality of chiclets or contact modules 212. The contact modules 212 hold contacts and conductive paths that electrically couple to the printed circuit 102 (FIG. 1). Each contact module 212 includes a contact lead frame (not shown) that is insert-molded or otherwise encased in a contact module housing 214 fabricated from a dielectric material. The module housing 214 has a mounting edge 216 configured for mounting to the printed circuit 102. Each contact module 212 includes a plurality of contact tails 218 that extend from the lead frame within the contact module 212 and extend through the mounting edge 216 of the module housing 214 for attaching to, for e.g., through-holes (not shown) of the printed circuit 102.

As shown, the connector terminals 152 include mating contacts that project outward from the mating surface 107 and may be bent or biased toward one end. The connector terminals 152 may have resilient bodies that are configured to engage a corresponding card terminal 122 of side surface 116 when the daughter card assembly 115 is moved into the engaged position. Although the connector terminals 152 are shown as projecting outward from the mating surface 107, in alternative embodiments, the connector 106 may include a plurality of contact cavities (not shown) where each contact cavity has a corresponding mating contact therein. In such alternative embodiments, the contact cavities may be configured to receive projections or tails of the card terminals. In other embodiments, the connector terminals 152 may be contact pads. Furthermore, either of the card terminals 122 or the connector terminals 152 may be stamped and formed or etched and formed. In addition, the card and connector terminals 122 and 152 may be solder balls, pads, press-fit contacts, compression contacts, and the like.

Figure 4:
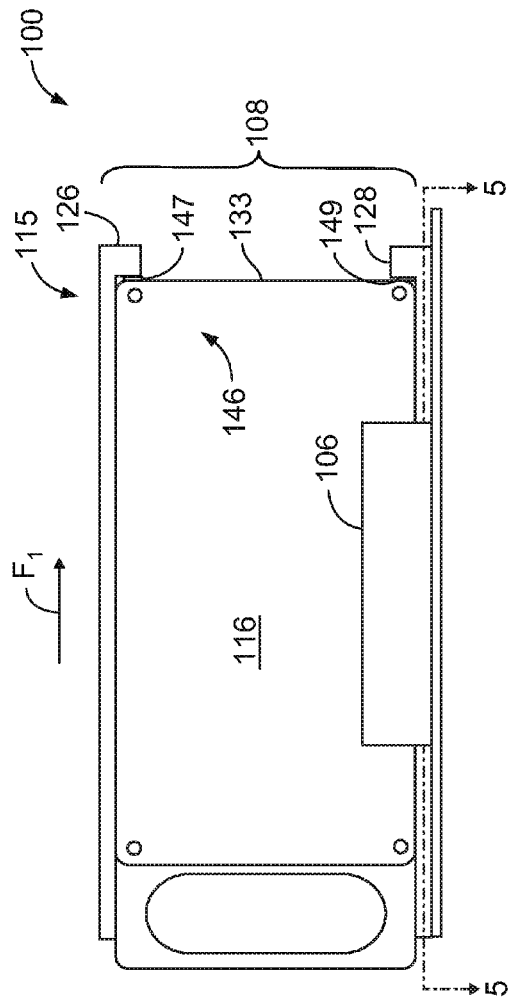
FIG. 4 is a side view of the daughter card assembly in an offset position with respect to the connector of FIG. 3.

FIGS. 4-7 provide greater detail of an interaction between the connector assembly 100 (FIG. 4) and the daughter card assembly 115 when the daughter card assembly 115 is moved between the offset and engaged positions through the guide assembly 108 (FIG. 4). Although the following description is with respect to the guide channel 136 (FIG. 5) and the guide rail 128, the description may be similarly applied to the guide channel 130 and the guide rail 126 shown in FIG. 1.

Figure 5:
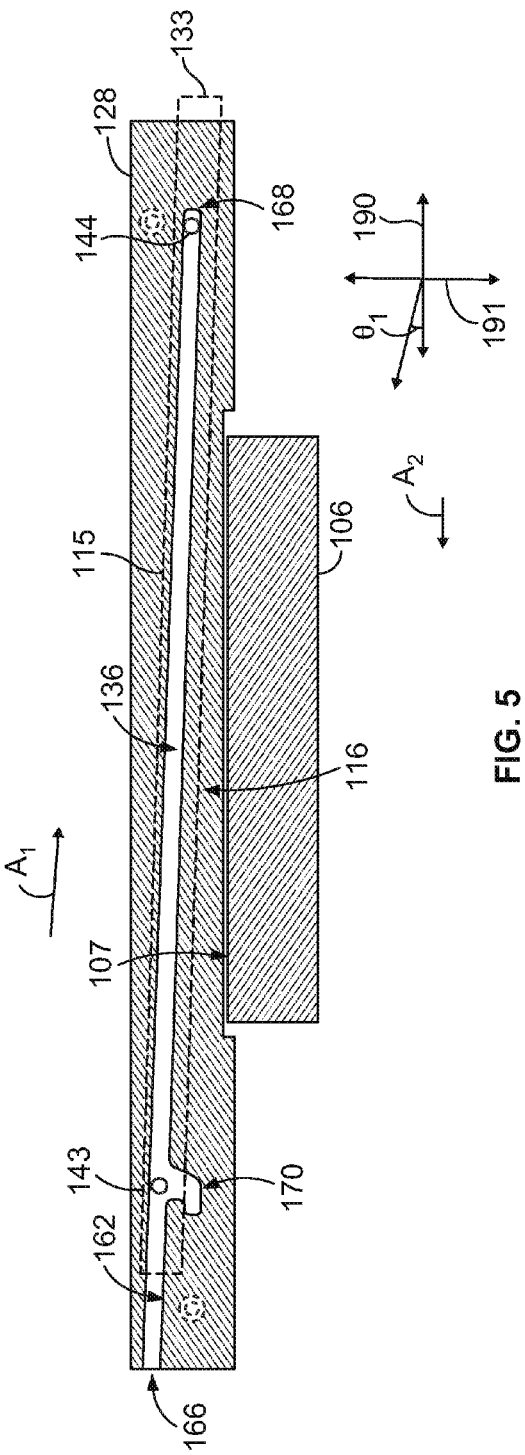
FIG. 5 is a cross-section of a guide rail taken along the line 5-5 in FIG. 4.

FIG. 4 is a side view of the daughter card assembly 115 in the offset position, and FIG. 5 is a cross-section of the guide rail 128 taken along a line 5-5 in FIG. 4. In the illustrated embodiment, the guide channel 136 has a fixed relationship with respect to the mating surface 107 (FIG. 5) of the connector 106. The guide channel 136 slidably interacts with the cam members 143 and 144 (FIG. 5) to move the side surface 116.

As shown in FIG. 5, the guide channel 136 is defined by an interior wall 162 and extends between a channel opening 166 and a channel end 168. When the cam members 143 and 144 are initially received by the guide channel 136 through the channel opening 166, the cam members 143 and 144 slide along the interior wall 162 during the loading stage in the first direction (indicated by the arrow $A_1$) that is generally along the longitudinal axis 190. As used herein, the term "generally along" includes a direction being parallel to an axis as well as forming an acute angle with respect to the axis that is less than or equal to about 30°. In particular embodiments, the acute angle is less than or equal to about 15°. When the daughter card assembly 115 is moved in the first direction, the daughter card assembly 115 may move in a linear manner to the offset position. Alternatively, the daughter card assembly 115 may move in a non-linear manner to the offset position. For example, at least a portion of the guide channel 136 may curve between the channel opening 166 and the channel end 168.

Also shown in FIG. 5, the cam member 144 may move between the channel opening 166 to a location proximate the channel end 168. The cam member 143 may move between the channel opening 166 to a location proximate a branch recess 170. The branch recess 170 may project in a transverse direction with respect to a direction of the guide channel 136. In FIG. 5, the branch recess 170 projects from the guide channel 136 in a direction generally along the lateral axis 191. When the daughter card assembly 115 is in the offset position, the side surface 116 may form the non-orthogonal angle $θ_1$ with respect to the mating surface 107 (and longitudinal axis 190).

Returning to FIG. 4, in some embodiments, an insertion force $F_1$ provided by the operator (human or machine) compresses the biasing springs 147 and 149 between the edge 133 and the guide rails 126 and 128. The biasing springs 147 and 149 of the biasing mechanism 146 may be at least partially compressed when the daughter card assembly 115 is in the offset position. Potential energy of the biasing springs 147 and 149 may be configured to move the daughter card assembly 115 in the second direction as indicated by the arrow $A_2$ (FIG. 5). In the illustrated embodiment, the second direction may be substantially opposite to the first direction. The second direction may extend generally along longitudinal axis 190. However, in alternative embodiments, the biasing mechanism 146 may be configured to press the daughter card assembly 115 in a different direction, such as along the lateral axis 191.

FIG. 6 is a side view of the daughter card assembly 115 in the engaged position, and FIG. 7 is a cross-section of the guide rail 128 taken along a line 7-7 in FIG. 6. The guide channel 136 (FIG. 7) may be sized and shaped to permit the daughter card assembly 115 to be rotated about the axis of rotation 193 that is proximate to the leading end 112 of the daughter card assembly 115. The side surface 116 may then move from the offset position to the engaged position. In the engaged position, the side and mating surfaces 116 and 107 are substantially parallel to one another.

As shown in FIG. 7, when the side surface 116 is rotated about the axis of rotation 193, the cam member 143 may move along an arcuate path 172 generally in a direction that is transverse to the guide channel 136. As such, the branch recess 170 is located along the guide channel 136 and is sized and shaped to permit the cam member 143 to move along the arcuate path 172. The branch recess 170 may receive the cam member 143 as shown in one enlarged detail view of FIG. 7.

After the side surface 116 is rotated into the engaged position, the insertion force $F_1$ (FIG. 4) provided by the operator may be released to allow the potential energy in the biasing springs 147 and 149 to provide a locking force $F_2$. The locking force $F_2$ may engage the daughter card assembly 115 so that the cam member 143 is pressed against the interior wall 162 of the branch recess 170. Also, in the illustrated embodiment, the locking force $F_2$ may move the cam member 143 a short distance within the branch recess 170. The interior wall 162 of the branch recess 170 may be shaped to receive the cam member 143. More specifically, the interior wall 162 of the branch recess 170 may partially conform to a contour of the cam member 143 to prevent the cam member 143 from inadvertently moving out of position. Furthermore, as shown in the other enlarged detail view of FIG. 7, the cam member 144 may also move along the guide channel 136 the short distance when the locking force $F_2$ is applied to the edge 133.

Also shown in FIGS. 6 and 7, the guide rail 128 and the cam members 143 and 144 may be sized and shaped to permit the daughter card assembly 115 to be rotated over the guide rail 128. When the daughter card assembly 115 is rotated about the axis of rotation 193, the edge 134 (FIG. 6) that extends alongside the guide rail 128 may clear the guide rail 128. For example, the guide channel 136 may have a depth DP (FIG. 6) that extends from a platform surface 139 of the guide rail 128 to a bottom surface of the guide channel 136. The cam members 143 and 144 may be sized and shaped with respect to the depth DP so that the edge 134 clears the platform surface 139 when the daughter card assembly 115 is rotated about the axis of rotation 193.

Figure 8:
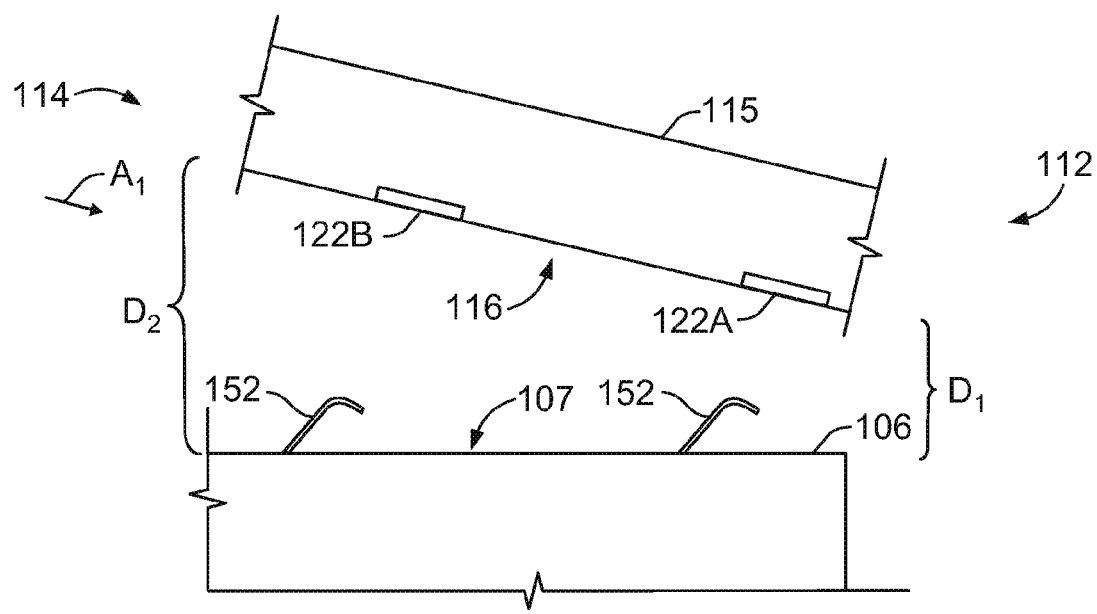
FIG. 8 illustrates a relative position of a side surface of the daughter card assembly to a mating surface of the connector when the daughter card assembly is in the offset position.
Figure 9:
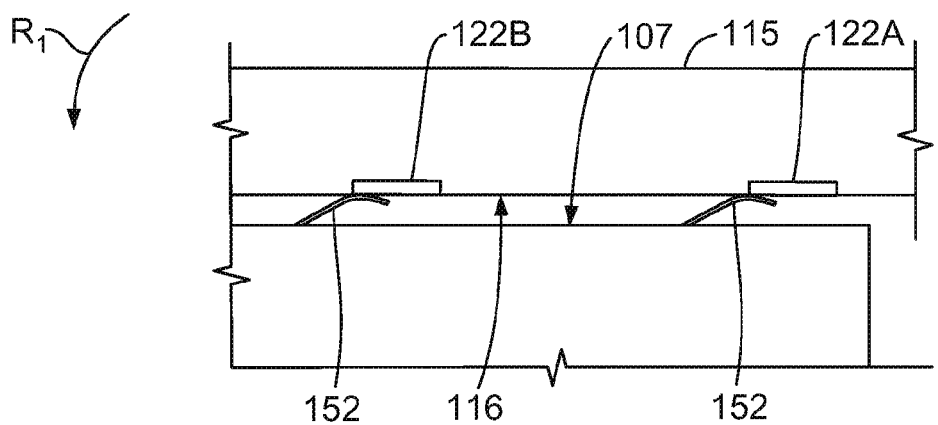
FIG. 9 illustrates a relative position of the side surface to the mating surface when the side surface interfaces with the mating surface.
Figure 10:
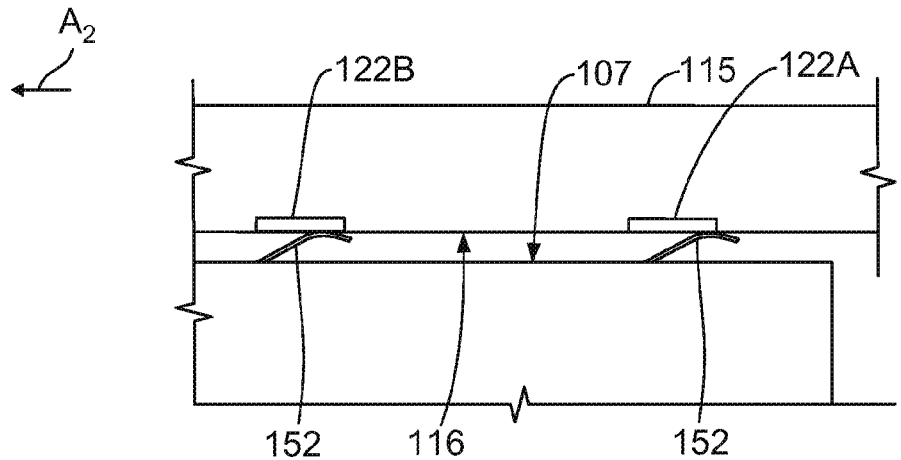
FIG. 10 illustrates a relative position of the side surface to the mating surface when the daughter card assembly is in an engaged position.

FIGS. 8-10 illustrates movement of the side surface 116 relative to the mating surface 107 when the daughter card assembly 115 is moved from the offset position to the engaged position. FIG. 8 shows the side surface 116 relative to the mating surface 107 after the daughter card assembly 115 has been moved in the first direction $A_1$ into the offset position. In the offset position, the side and mating surfaces 116 and 107 may form a non-orthogonal angle with respect to each other. More specifically, card terminals 122A that are proximate to the leading end 112 and card terminals 122B that are proximate to the trailing end 114 may be positioned at different distances away from the mating surface 107. In FIGS. 8-10, the card terminals 122A and 122B and the connector terminals 152 are mating contacts configured to establish an electrical connection. However, in alternative embodiments, the card terminals 122A and 122B and the connector terminals 152 may include optical terminals configured to establish an optical connection.

By way of example, as shown in FIG. 8, the card terminal 122A that is proximate to the leading end 112 is a distance $D_1$ away from the mating surface 107, and the card terminal 122B that is proximate the trailing end 114 is a distance $D_2$ away from the mating surface 107. The distance $D_1$ is less than the distance $D_2$. As such, the side surface 116 forms the non-orthogonal angle $\theta_1$ (FIG. 1) with respect to the mating surface 107 in the offset position such that the card terminals 122 that are proximate to the leading end 112 (i.e., closer to the leading end 112) of the daughter card assembly 115 are closer to the mating surface 107 than the card terminals 122 proximate to the trailing end 114.

FIG. 9 shows the side surface 116 relative to the mating surface 107 after the daughter card assembly 115 has been rotated (indicated by the arrow $R_1$) from the offset position toward the mating surface 107 into the engaged position. As shown in FIG. 9, card terminals 122A, 122B may be engaged with the connector terminals 152 or the mating surface 107 after being rotated. The side and mating surfaces 116 and 107 may be substantially parallel to one another after the daughter card assembly 115 has been rotated.

FIG. 10 illustrates the side surface 116 after being moved in the second direction $A_2$. As described above, embodiments may optionally include the biasing mechanism 146 (FIG. 1). The biasing mechanism 146 may move the daughter card assembly 115 a short distance alongside the mating surface 107 when in the engaged position so that the cam member 143 (FIG. 1) is moved within the branch recess 170 (FIG. 7) to facilitate holding the daughter card assembly 115 in the engaged position. The biasing mechanism 146 may be configured to press the cam member 143 and the interior wall of the corresponding guide channel against each other to generate frictional forces. The frictional forces may resist movement of the daughter card assembly 115 to prevent an inadvertent release of the daughter card assembly 115 from the engaged position.

In the illustrated embodiment, the card terminals 122A, 122B and the connector terminals 152 may have a sufficient wipe length such that the connector and card terminals 152 and 122A, 122B remain electrically engaged when the daughter card assembly 115 is moved by the biasing mechanism 146. Alternatively, the connector and card terminals 152 and 122A, 122B may become electrically engaged after the daughter card assembly 115 is moved by the biasing mechanism 146.

Figure 11:
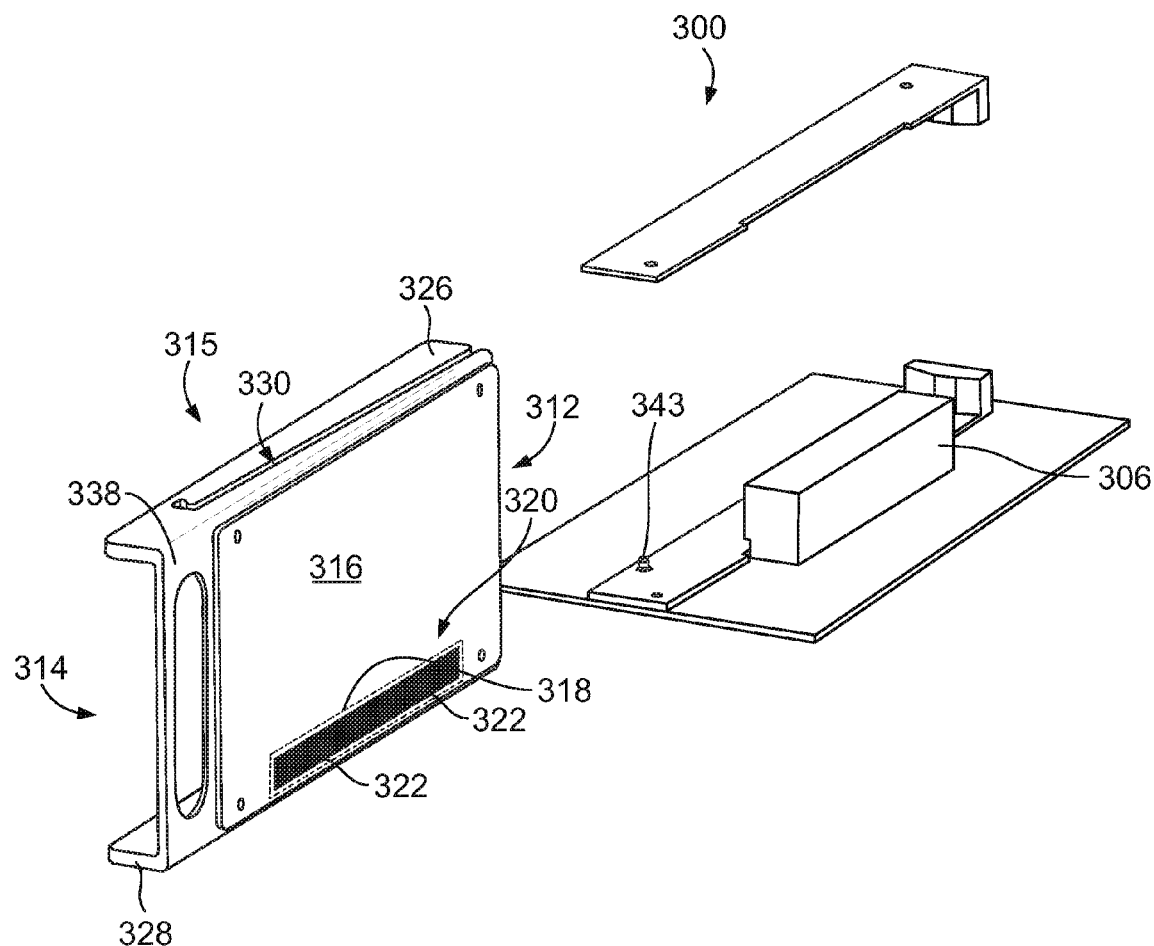
FIG. 11 is a front perspective of a connector assembly formed in accordance with one embodiment.

FIG. 11 is a front perspective view of a connector assembly 300 formed in accordance with another embodiment that is configured to engage a removable daughter card assembly 315. The connector assembly 300 includes cam members 343 (only one is shown in FIG. 11) and a connector 306 having a fixed position with respect to the cam members 343. The daughter card assembly 315 may have similar features as the daughter card assembly 115 described above. The daughter card assembly 315 includes leading and trailing ends 312 and 314 and a side surface 316 that extends therebetween. The side surface 316 includes a terminal area or footprint 318 where an array 320 of card terminals 322 is located. The daughter card 315 may include a card body 338 and a pair of guide rails 326 and 328. The card body 338 may extend between the guide rails 326 and 328. The guide rails 326 and 328 may include guide channels 330 (only one guide channel 330 is shown) that have fixed positions relative to the side surface 316 and the array 320 of card terminals 322. The guide channels 330 are configured to engage cam members 343 that have fixed positions with respect to the connector assembly 300.

Figure 12:
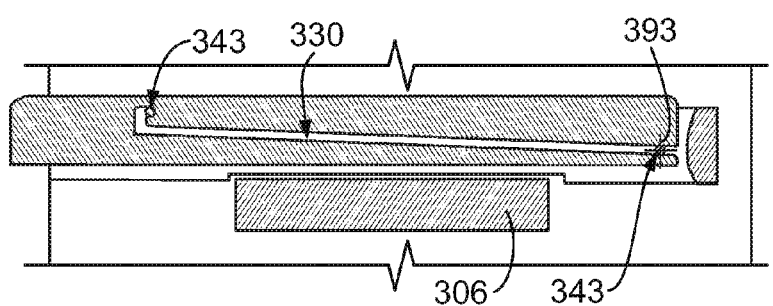
FIG. 12 illustrates cam members interacting with a guide channel to position a daughter card assembly.

FIG. 12 illustrates locations of the cam members 343 within the guide channel 330 when the removable card assembly 315 (FIG. 11) is in an engaged position with respect to the connector 306. First, the guide channels 330 slidably interact with the cam members 343 to direct the daughter card assembly 315 to an offset position. The removable daughter card assembly 315 may then be rotated to the engaged position shown in FIG. 12 by rotating the removable daughter card assembly 315 about an axis of rotation 393 that extends through the cam member 343 located proximate to the leading end 312. Although not shown, the daughter card 315 may include a biasing mechanism similar to the biasing mechanism 146 that may be attached to the card body 338. The biasing mechanism may also be attached to the connector assembly 300.

Figure 13:
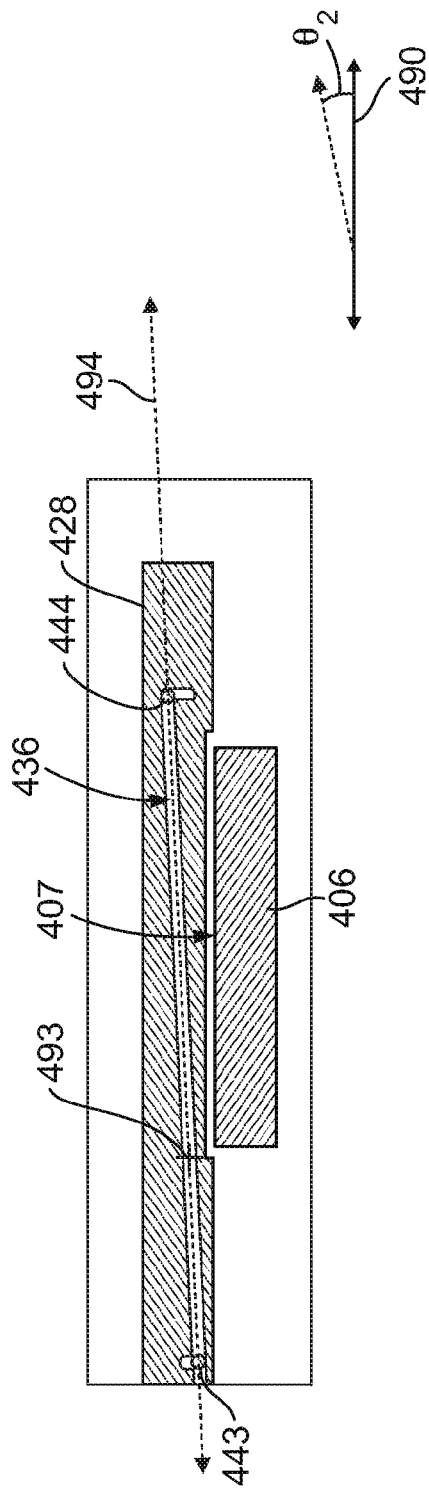
FIG. 13 illustrates an alternative guide assembly in which the daughter card assembly is in an offset position.
Figure 14:
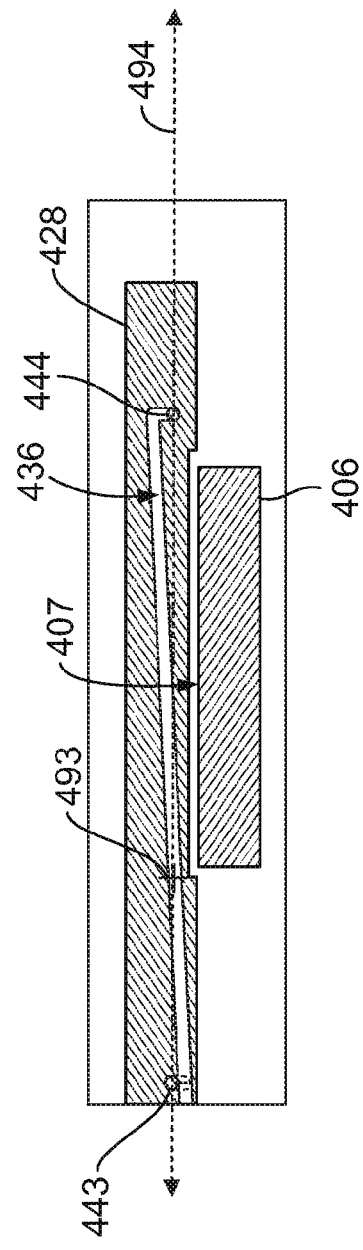
FIG. 14 illustrates the guide assembly of FIG. 13 in which the daughter card assembly is in an engaged position.

FIGS. 13 and 14 are cross-sections of a guide rail 428 for a connector assembly (not shown) formed in accordance with an alternative embodiment. In alternative embodiments, a daughter card assembly (not shown) may rotate about an axis of rotation that is not proximate to a leading end of the daughter card assembly. As shown in FIGS. 13 and 14, the guide rail 428 includes a guide channel 436 that is configured to direct a removable daughter card (not shown) to different desired positions relative to a connector 406 of the connector assembly. As shown, the guide channel 436 may direct cam members 443 and 444 to move the daughter card assembly to an offset position (shown in FIG. 13) and then also to an engaged position (shown in FIG. 14). In the embodiment shown in FIGS. 13 and 14, a trailing end of the daughter card assembly is closer to the connector than a leading end of the daughter card assembly when the daughter card assembly is in the offset position. More specifically, a vertical plane 494 that extends through the cam members 443 and 444 when the daughter card assembly is in the offset position may form a non-orthogonal angle $\theta_2$ with respect to a longitudinal axis 490 that extends parallel to a mating surface 407 of the connector 406. However, when the daughter card is in the engaged position, the vertical plane 494 may be parallel to the mating surface 407. Accordingly, the daughter card may rotate about an axis of rotation 493 to move the daughter card between the offset and engaged positions.

Accordingly, embodiments described herein include connector assemblies and daughter card assemblies that are configured to communicatively engage each other along side interfaces. As described above, a daughter card assembly may have guide channels or cam members that have fixed positions relative to a side surface of the daughter card assembly. Likewise, a connector assembly may include a connector that may have guide channels or cam members that have a fixed position relative to a mating surface of the connector. Such embodiments may be configured to direct the side surface of the daughter card assembly to an offset position with respect to the mating surface of the connector. The side and mating surfaces may form a non-orthogonal angle with respect to each other in the offset position. For example, in the offset position, card terminals proximate to the leading end and card terminals proximate to the trailing end are positioned at different distances away from the mating surface. The guide channel is configured to permit the daughter card assembly to be rotated about an axis of rotation where the daughter card assembly moves from the offset position to the engaged position. Furthermore, embodiments described herein optionally include biasing mechanisms.

Although the illustrated embodiments are described with reference to electrically interconnecting printed circuits and, more specifically, circuit boards, the description herein is not intended to be limited to printed circuits or circuit boards. Embodiments described herein may also be used to interconnect other components where a component has an array of terminals that complement or are configured to engage another array of terminals.

In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly configured to engage a removable daughter card assembly having leading and trailing ends and a side surface extending therebetween, the connector assembly comprising:
    a connector having a mating surface including an array of connector terminals thereon, the mating surface interfacing with the side surface of the daughter card assembly when the daughter card assembly is moved to an engaged position, the array of connector terminals being configured to engage an array of card terminals on the side surface when the daughter card assembly is moved to the engaged position; and
    a guide assembly comprising a guide channel and a cam member that slidably engages the guide channel to direct the daughter card assembly to an offset position, the side and mating surfaces forming a non-orthogonal angle with respect to each other when the daughter card assembly is in the offset position such that card terminals proximate to the leading end and card terminals proximate to the trailing end are positioned at different distances away from the mating surface, wherein the guide channel is configured to permit the daughter card assembly to be rotated about an axis of rotation, the daughter card assembly moving from the offset position to the engaged position where the side and mating surfaces are substantially parallel to one another.

2. The connector assembly in accordance with claim 1 wherein the card terminals proximate to the leading end are closer to the mating surface than the card terminals proximate to the trailing end, the axis of rotation being proximate to the leading end.

3. The connector assembly in accordance with claim 1 wherein the guide channel is defined by an interior wall, the connector assembly further comprising a biasing mechanism configured to press the cam member and the interior wall of the guide channel against each other to generate frictional forces, the frictional forces resisting movement of the daughter card assembly to prevent an inadvertent release of the daughter card assembly from the engaged position.

4. The connector assembly in accordance with claim 3 wherein the daughter card assembly moves in a first direction when the cam member slides along the guide channel to the offset position, the biasing mechanism pressing the daughter card assembly in a second direction that is substantially opposite to the first direction.

5. The connector assembly in accordance with claim 3 wherein the biasing mechanism includes a biasing spring, the biasing spring being at least partially compressed when the daughter card assembly is rotated to the engaged position, wherein potential energy of the biasing spring presses the cam member and the interior wall against each other to generate the frictional forces.

6. The connector assembly in accordance with claim 1 further comprising a guide rail having a fixed position relative to the mating surface of the connector, the guide rail including the guide channel and the cam member having a fixed position relative to the side surface.

7. The connector assembly in accordance with claim 6 wherein the guide rail is a first guide rail and the guide channel is a first guide channel, the connector assembly further comprising a second guide rail having a second guide channel, the side surface of the daughter card assembly extending substantially between the first and second guide channels.

8. The connector assembly in accordance with claim 6 wherein the guide channel has a depth extending into the guide channel from a platform surface and the removable card has an edge that extends between the leading and trailing ends, wherein the cam member is sized and shaped so that the edge clears the platform surface when the daughter card assembly is rotated about the axis of rotation.

9. The connector assembly in accordance with claim 1 further comprising a guide rail having a fixed position relative to the side surface of the daughter card assembly, the guide rail including the guide channel and the cam member having a fixed position relative to the mating surface.

10. The connector assembly in accordance with claim 1 wherein the cam member includes first and second cam members that slidably engage the guide channel, the first cam member being located proximate to the leading end of the daughter card assembly and the second cam member being located proximate to the trailing end of the daughter card assembly when the daughter card assembly is in the engaged position.

11. The connector assembly in accordance with claim 1 wherein the cam member slides in a linear direction relative to the guide channel when the daughter card assembly is moved to the offset position, the cam member moving along an arcuate path when the daughter card assembly is rotated to the engaged position.

12. A connector assembly configured to engage a removable daughter card assembly having leading and trailing ends and a side surface extending therebetween, the connector assembly comprising:
   a connector having a mating surface including an array of connector terminals thereon, the mating surface interfacing with the side surface of the daughter card assembly when the daughter card assembly is moved to an engaged position, the array of connector terminals being configured to engage an array of card terminals on the side surface when the daughter card assembly is moved to the engaged position; and
   a guide channel extending along and having a fixed position relative to the mating surface, the guide channel configured to slidably interact with a cam member attached to the daughter card assembly to direct the daughter card assembly to an offset position, the side and mating surfaces forming a non-orthogonal angle with respect to each other when the daughter card assembly is in the offset position such that card terminals proximate to the leading end and card terminals proximate to the trailing end are different distances away from the mating surface, wherein the guide channel is configured to permit the daughter card assembly to be rotated about an axis of rotation, the daughter card assembly moving from the offset position to the engaged position where the side and mating surfaces are substantially parallel to one another.

13. The connector assembly in accordance with claim 12 wherein the guide channel is configured such that the card terminals proximate to the leading end are closer to the mating surface than the card terminals proximate to the trailing end, the axis of rotation being proximate to the leading end.

14. The connector assembly in accordance with claim 12 wherein the guide channel is defined by an interior wall, the connector assembly further comprising a biasing mechanism configured to press the cam member and the interior wall of the guide channel against each other to generate frictional forces, the frictional forces resisting movement of the daughter card assembly to prevent an inadvertent release of the daughter card assembly from the engaged position.

15. The connector assembly in accordance with claim 14 wherein the guide channel is configured to direct the daughter card assembly in a first direction when the cam member slides along the guide channel to the offset position, the biasing mechanism pressing the daughter card assembly in a second direction that is substantially opposite to the first direction.

16. The connector assembly in accordance with claim 14 wherein the biasing mechanism has a fixed position relative to the connector.

17. A removable daughter card assembly configured to be inserted into a system to engage a connector, the daughter card assembly comprising:
   leading and trailing ends, the leading end being inserted into the system before the trailing end;
   a side surface extending between the leading and trailing ends;
   an array of card terminals on the side surface that are configured to engage an array of connector terminals on a mating surface of the connector; and
   a guide channel extending along and having a fixed position relative to the side surface, the guide channel configured to slidably interact with a cam member that has a fixed position relative to the mating surface of the connector, the guide channel directing the side surface to an offset position relative to the mating surface, the side and mating surfaces forming a non-orthogonal angle with respect to each other when the side surface is in the offset position such that card terminals proximate to the leading end and card terminals proximate to the trailing end are different distances away from the mating surface, wherein the guide channel is configured to permit the side surface to be rotated about an axis of rotation, the side surface moving from the offset position to the engaged position where the side and mating surfaces are substantially parallel to one another.

18. The daughter card assembly in accordance with claim 17 wherein the guide channel is defined by an interior wall, the daughter card assembly further comprising a biasing mechanism configured to press the cam member and the interior wall of the guide channel against each other to generate frictional forces, the frictional forces resisting movement of the side surface to prevent an inadvertent release of the side surface from the engaged position.

19. The daughter card assembly in accordance with claim 18 wherein the side surface moves in a first direction when the cam member slides along the guide channel to the offset position, the biasing mechanism pressing the side surface in a second direction that is substantially opposite to the first direction.

20. The daughter card assembly in accordance with claim 18 wherein the biasing mechanism comprises a biasing spring, the biasing spring forwardly projecting from the leading edge.

* * * * *